United States Patent
Kanemaru

(10) Patent No.: US 9,407,222 B2
(45) Date of Patent: Aug. 2, 2016

(54) VARIABLE MATCHING CIRCUIT AND AMPLIFIER

(71) Applicant: PANASONIC CORPORATION, Osaka (JP)

(72) Inventor: Masaki Kanemaru, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 12 days.

(21) Appl. No.: 14/396,514

(22) PCT Filed: Feb. 26, 2014

(86) PCT No.: PCT/JP2014/001035
§ 371 (c)(1),
(2) Date: Oct. 23, 2014

(87) PCT Pub. No.: WO2014/132645
PCT Pub. Date: Sep. 4, 2014

(65) Prior Publication Data
US 2015/0116037 A1    Apr. 30, 2015

(30) Foreign Application Priority Data

Feb. 27, 2013   (JP) .................................. 2013-037685

(51) Int. Cl.
| H03G 3/00 | (2006.01) |
| H03F 3/00 | (2006.01) |
| H03F 3/193 | (2006.01) |
| H03G 3/30 | (2006.01) |

(Continued)

(52) U.S. Cl.
CPC .............. *H03G 3/008* (2013.01); *H03F 1/565* (2013.01); *H03F 3/005* (2013.01); *H03F 3/193* (2013.01);

(Continued)

(58) Field of Classification Search
CPC ................................ H03G 3/008; H03F 1/565
USPC ............................................................ 333/32
See application file for complete search history.

(56) References Cited

U.S. PATENT DOCUMENTS

| 8,212,615 B2 | 7/2012 | Masuda et al. |
| 2005/0077964 A1 | 4/2005 | Maeda |

(Continued)

FOREIGN PATENT DOCUMENTS

| JP | 42-20085 B1 | 10/1967 |
| JP | 54-046456 A | 4/1979 |

(Continued)

OTHER PUBLICATIONS

International Search Report for Application No. PCT/JP2014/001035 dated Jun. 3, 2014.

(Continued)

*Primary Examiner* — Stephen E Jones
*Assistant Examiner* — Scott S Outten
(74) *Attorney, Agent, or Firm* — Pearne & Gordon LLP

(57) ABSTRACT

A variable matching circuit includes a transformer which is disposed between first and second transistor circuits. A primary inductor device and a secondary inductor device are magnetically coupled in the transformer. The primary inductor device is connected between an output terminal of the first transistor circuit and a bias circuit for the first transistor circuit. The secondary inductor device is connected between an input terminal of the second transistor circuit and a bias circuit for the second transistor circuit. Connection points between the primary inductor device and the bias circuit for the first transistor circuit and between the secondary inductor device and the bias circuit for the second transistor circuit are connected to first and second capacitive elements, respectively. At least one of inductance values of the respective primary and secondary inductor devices and capacitance values of the respective first and second capacitive elements is variable.

12 Claims, 15 Drawing Sheets

(51) Int. Cl.
*H03F 1/56* (2006.01)
*H03F 3/24* (2006.01)
*H03F 3/60* (2006.01)

(52) U.S. Cl.
CPC ............... *H03F 3/245* (2013.01); *H03F 3/601* (2013.01); *H03G 3/3052* (2013.01); *H03F 2200/222* (2013.01); *H03F 2200/294* (2013.01); *H03F 2200/408* (2013.01); *H03F 2200/423* (2013.01); *H03F 2200/451* (2013.01); *H03F 2200/534* (2013.01); *H03F 2200/537* (2013.01); *H03F 2200/541* (2013.01)

(56) References Cited

U.S. PATENT DOCUMENTS

| 2010/0271122 | A1 | 10/2010 | Masuda et al. |
| 2011/0115565 | A1* | 5/2011 | Cabanillas ............ H03F 1/0277 330/307 |

FOREIGN PATENT DOCUMENTS

| JP | 58-150321 | A | 9/1983 |
| JP | 63-24656 | Y2 | 7/1988 |
| JP | 1-151809 | A | 6/1989 |
| JP | 01-218202 | A | 8/1989 |
| JP | 04-002225 | A | 1/1992 |
| JP | 11-055047 | A | 2/1999 |
| JP | 3517166 | B2 | 1/2004 |
| JP | 2005-143079 | A | 6/2005 |
| JP | 2011-142384 | A | 7/2011 |
| JP | 4903834 | B2 | 1/2012 |

OTHER PUBLICATIONS

Ning. Li, et al., "A 24 dB Gain 51-68 GHz CMOS Low Noise Amplifier Using Asymmetric-Layout Transistors", IEEE ESSIRC., pp. 342-345, Sep. 2010.

* cited by examiner

FIG.4
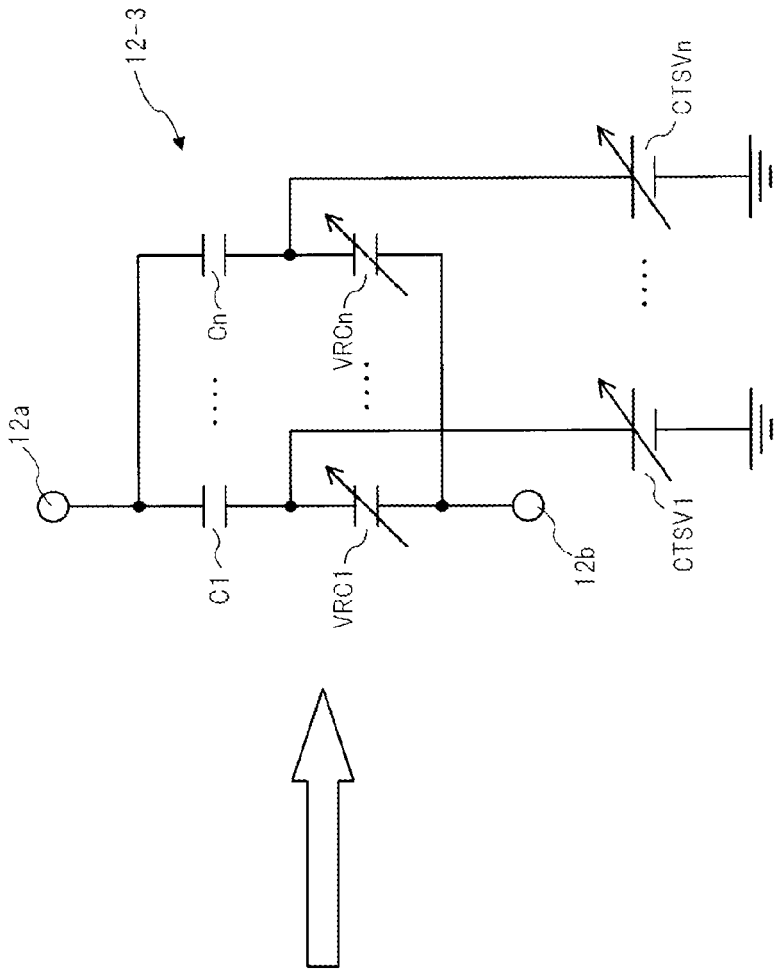
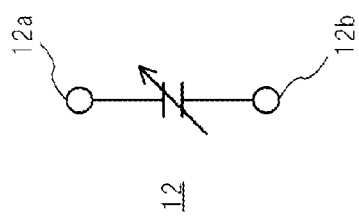

VARIABLE MATCHING CIRCUIT AND AMPLIFIER

TECHNICAL FIELD

The present disclosure relates to a variable matching circuit and an amplifier which change a gain for amplifying a high frequency signal.

BACKGROUND ART

In a Radio-Frequency Integrated Circuit (IC) for inputting and outputting a high frequency signal, a variable gain amplifier for changing a gain is disposed in order to obtain a high frequency signal of electric power in a desired range. When the amplifier is provided with a gain variable function, a performance (for example frequency characteristics, noise figure characteristics, and gain linearity) of the amplifier itself may be degraded.

For example, in a receiver, a low noise amplifier (LNA) for amplifying a signal received by a receiving antenna is usually disposed in a following stage of the receiving antenna. For example, when the low noise amplifier has the variable gain function, performance degradation of the low noise amplifier remarkably appears, resulting in performance degradation of the receiver. For example, when a millimeter wave signal of several tens of GHz is handled, an influence of performance degradation of a transistor as an amplifying element used in the low noise amplifier is significant.

As related art with respect to the low noise amplifier having the variable gain function, Non Patent Literature 1 is known. A low noise amplifier disclosed in Non Patent Literature 1 includes a plurality of transistors connected in multiple stages, and a DC gate voltage value applied to a gate of each transistor is variable, and thus it is possible to adjust a current value flowing through the transistor. Accordingly, the low noise amplifier can change a gain.

FIG. 14 is a graph illustrating a relationship between the DC gate voltage applied to the gate of the transistor and the current flowing through the transistor. When a DC gate voltage which is higher than or equal to a threshold voltage $V\_th$ of the transistor is applied to the transistor, the current flowing through the transistor increases according to an increase in the DC gate voltage. A gradient of the current with respect to the DC gate voltage gradually increases after the DC gate voltage exceeds the threshold voltage $V\_th$, and thus has linear characteristics.

In order to increase gain linearity of the low noise amplifier, it is preferable to use the DC gate voltage (for example, a DC gate voltage $V\_h$) in which the gradient of the current with respect to the DC gate voltage is in a linear region. However, in the low noise amplifier for changing the gain by changing the current flowing through the transistor according to the DC gate voltage (for example, refer to Non Patent Literature 1), for example, when the gain is changed into a low gain, gain linearity of the low noise amplifier may be degraded by using the DC gate voltage (for example, a DC gate voltage $V\_l$) in which the gradient of the current with respect to the DC gate voltage is in a nonlinear region.

In addition, since the threshold voltage $V\_th$ varies according to process variations in a manufacturing process of the IC, when a low DC gate voltage (for example, the gate voltage $V\_l$) is used, the gradient of the current with respect to the DC gate voltage is likely to be nonlinear compared to a case where a high DC gate voltage (for example, the DC gate voltage $V\_h$) is used. For this reason, the gain characteristics of the low noise amplifier when the threshold voltage $V\_th$ is varied may be further degraded than the gain characteristics of the case where the high DC gate voltage (for example, the DC gate voltage $V\_h$) is used.

In order to solve the above problem, a method for changing the gain by changing a circuit constant of an input matching circuit or an output matching circuit disposed in a previous stage or a following stage of the transistor without changing the DC gate voltage of the transistor is proposed (for example, refer to Patent Literatures 1 to 3).

A double-tuned transformer disclosed in Patent Literature 1 includes a grounded capacitor connected to a first tuning winding wire in an antenna tuning transformer disposed in the following stage of the receiving antenna. The double-tuned transformer changes a capacitance value of the grounded capacitor, and thus input impedance is matched, and the gain is changed.

An antenna matching circuit disclosed in Patent Literature 2 is disposed between an antenna and a tuner module, and includes an inductor, a capacitor, and a PIN diode. The antenna matching circuit turns the PIN diode ON or OFF according to a signal output by the tuner module connected to a following stage. The antenna matching circuit changes the impedance according to ON of the PIN diode, and thus the antenna matching circuit is changed from an antenna matching state to an antenna non-matching state, and the gain is changed.

In a variable load circuit connected to an output stage of a conductance circuit, a gain variable amplifying circuit disclosed in Patent Literature 3 adjusts a capacitance value of a variable capacity, and thus the gain is changed.

CITATION LIST

Non Patent Literature

Non Patent Literature 1: Ning. Li, et al., "A 24 dB Gain 51-68 GHz CMOS Low Noise Amplifier Using Asymmetric-Layout Transistors", IEEE ESSIRC., pp. 342-345, September 2010

Patent Literature

Patent Literature 1: Japanese Patent No. 3517166
Patent Literature 2: JP-A-2011-142384
Patent Literature 3: Japanese Patent No. 4903834

SUMMARY OF INVENTION

Technical Problem

However, in the above described Non Patent Literature 1, and Patent Literatures 1 to 3, for example, when the gain is changed into the low gain, a capacitive element is connected in series to a high frequency signal path, and thus loss in the high frequency signal input from the receiving antenna occurs, and it is difficult for the high frequency signal to operate in broadband.

In order to solve the above problem of the related art, an object of the present disclosure is to provide a variable matching circuit and an amplifier for changing a gain by reducing a loss in an input high frequency signal.

Solution to Problem

The present disclosure provides a variable matching circuit including: a first transistor circuit which amplifies a high frequency signal; a second transistor circuit which amplifies the high frequency signal amplified by the first transistor circuit; a transformer which is disposed between the first and second transistor circuits, wherein a primary inductor device and a secondary inductor device are magnetically coupled in the transformer; a first capacitive element; and a second capacitive element, wherein the primary inductor device is connected between an output terminal of the first transistor circuit and a bias circuit for the first transistor circuit, the secondary inductor device is connected between an input terminal of the second transistor circuit and a bias circuit for the second transistor circuit, a connection point between the primary inductor device and the bias circuit for the first transistor circuit is connected to the first capacitive element, a connection point between the secondary inductor device and the bias circuit for the second transistor circuit is connected to the second capacitive element, and at least one of inductance values of the respective primary and secondary inductor devices and capacitance values of the respective first and second capacitive elements is variable.

The present disclosure also provides an amplifier including: a first transistor circuit which inputs a high frequency signal; a second transistor circuit which amplifies the high frequency signal amplified by the first transistor circuit; a first DC potential transmission circuit which applies a DC control voltage to an input terminal of the first transistor circuit; a second DC potential transmission circuit which applies a DC power source voltage to an output terminal of the second transistor circuit; a transformer which is disposed between the respective first and second transistor circuits, wherein a primary inductor device and a secondary inductor device are magnetically coupled in the transformer; a first capacitive element; and a second capacitive element, wherein the primary inductor device is connected between an output terminal of the first transistor circuit and a bias circuit for the first transistor circuit, the secondary inductor device is connected between an input terminal of the second transistor circuit and a bias circuit for the second transistor circuit, a connection point between the primary inductor device and the bias circuit for the first transistor circuit is connected to the first capacitive element, a connection point between the secondary inductor device and the bias circuit for the second transistor circuit is connected to the second capacitive element, and at least one of inductance values of the respective primary and secondary inductor devices and capacitance values of the respective first and second capacitive elements is variable.

Advantageous Effects of Invention

According to the present disclosure, it is possible to reduce a loss in an input high frequency signal, to change a gain, and to reduce reflection of the high frequency signal in a boundary of impedance matching with an antenna, and thus it is possible to improve a noise figure, and to expand a frequency bandwidth.

BRIEF DESCRIPTION OF DRAWINGS

FIG. 4 is a diagram illustrating a third circuit configuration example in which the respective first and second capacitive elements include the variable capacitance values.

DESCRIPTION OF EMBODIMENTS

Background of Each Embodiment

Figure 15:
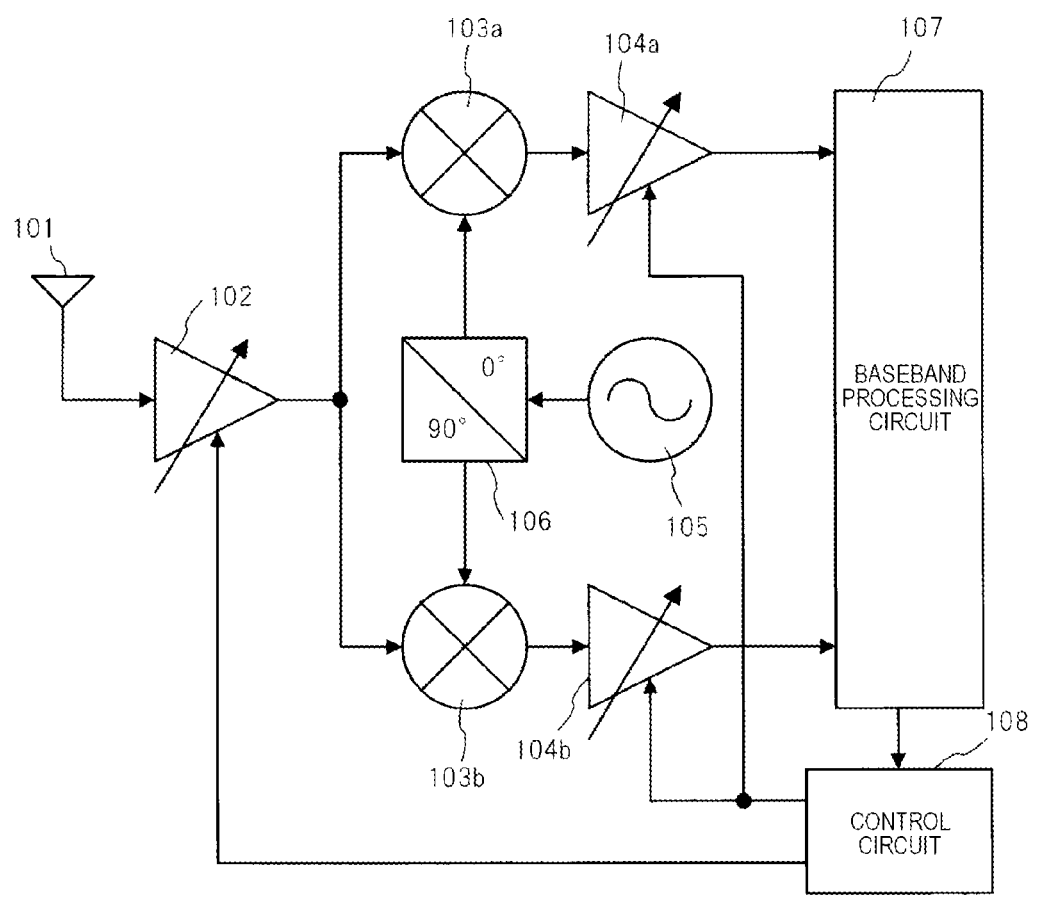
FIG. 15 is a block diagram illustrating an example of an internal configuration of a receiver of the related art, which receives a high frequency signal.

First, before describing each embodiment of a variable matching circuit and an amplifier according to the present disclosure, the details of each of the embodiments will be described with reference to FIG. 15. FIG. 15 is a block diagram illustrating an example of an internal configuration of a receiver of the related art, which receives a high frequency signal.

The receiver illustrated in FIG. 15 includes a low noise amplifier (LNA) 102 to which an antenna 101 is connected, mixers 103a and 103b, a local oscillator 105, a π/2 phase shifter 106, variable gain amplifiers (VGA) 104a and 104b, a baseband processing circuit 107, and a control circuit 108.

In the receiver illustrated in FIG. 15, the high frequency signal received by the antenna 101 is input to the low noise amplifier 102 in a following stage to be amplified, and is branched into two channels to be input to the mixers 103a and 103b. In the mixers 103a and 103b, a local oscillation signal generated by the local oscillator 105 and the n/2 phase shifter 106, and the high frequency signal branched into the two systems are mixed to be converted into a baseband signal.

The baseband signal is amplified up to a predetermined amplitude in the variable gain amplifiers 104a and 104b, and then is input to the baseband processing circuit 107. Furthermore, it is necessary that the amplitude of the baseband signal input to the baseband processing circuit 107 be maintained within a predetermined range regardless of the amplitude of the high frequency signal received by the antenna 101.

For this reason, in the receiver illustrated in FIG. 15, the low noise amplifier 102 and the variable gain amplifiers 104a and 104b have a variable gain function. Each gain of the low noise amplifier 102 and the variable gain amplifiers 104a and 104b is determined according to a gain control signal generated by the control circuit 108.

In Patent Literatures 1 and 2 described above, the antenna matching circuit connected to the following stage of the antenna changes the circuit constant (for example, the capacitance value of the grounded capacitor, and a capacitance value of the capacitive element connected between the antenna and the tuner module) of the circuit element included in the antenna matching circuit, and thus the gain is changed.

Here, for example, the antenna matching circuit is changed from the matching state to the non-matching state, and thus when the gain is changed into the low gain, the electric power of the high frequency signal reflected by the boundary of the antenna matching circuit becomes higher. The reflected high frequency signal is emitted from the antenna to outside, and thus unnecessary radiation becomes larger.

In addition, the reflected high frequency signal generates a standing wave between the antenna and the antenna matching circuit, and thus the standing wave is a factor for causing an abnormal operation (for example, damage of the circuit element) of the circuit. Further, the noise figure characteristics used as a parameter of a receiving performance of the receiver are considerably degraded when the loss in the high frequency signal occurs in a place adjacent to the antenna.

For this reason, when the reflection between the antenna and the antenna matching circuit becomes larger, the loss in the high frequency signal occurs in the place adjacent to the antenna, and thus the noise figure characteristics become larger.

On the other hand, in Patent Literature 3 described above, the output matching circuit for matching the impedance with respect to the circuit in the following stage is connected to the output stage of the conductance circuit. The output matching circuit includes a first capacitive element which is connected in series to a signal path of the high frequency signal, and a second capacitive element which is connected between the signal path of the high frequency signal and a ground.

When the output matching circuit in which the capacitive element is connected in series to the signal path of the high frequency signal is used, the frequency bandwidth capable of impedance matching is narrowed, and the loss in the high frequency signal occurring in the output matching circuit becomes larger. In particular, in a wireless communication for handling the millimeter wave signal of several tens of GHz, it is necessary that the low noise amplifier include a broad bandwidth, and it is preferable that the loss in the high frequency signal be small.

Therefore, in each of the following embodiments, an example of a variable matching circuit used in an amplifier for amplifying a high frequency signal, in which degradation of signal reflection characteristics and noise figure characteristics with respect to an antenna are suppressed, the high frequency signal is operated in broadband by reducing a loss therein, and a gain is changed, and an example of an amplifier will be described.

First Embodiment

Figure 1:
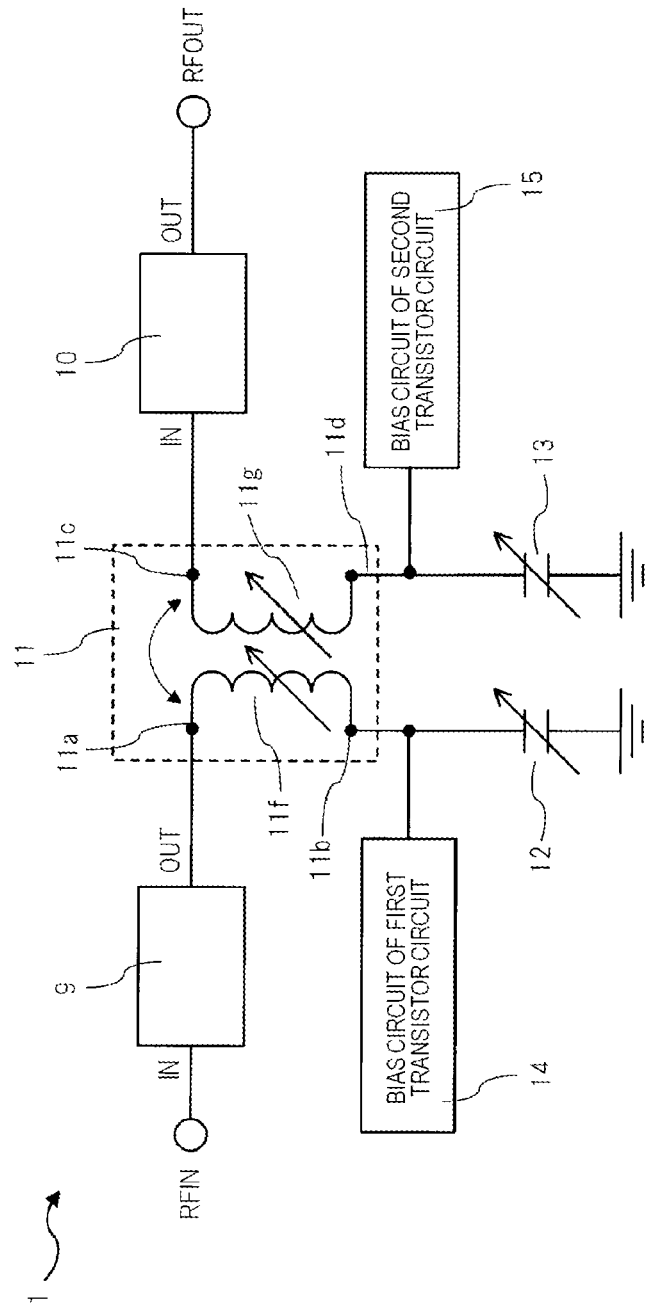
FIG. 1 is a diagram illustrating an internal configuration of a variable matching circuit according to a first embodiment.

FIG. 1 is a diagram illustrating an internal configuration of a variable matching circuit 1 according to a first embodiment. The variable matching circuit 1 illustrated in FIG. 1 includes a first transistor circuit 9, a second transistor circuit 10, a transformer 11, a first capacitive element 12, and a second capacitive element 13. Furthermore, the variable matching circuit 1 may further include a bias circuit 14 for the first transistor circuit, and a bias circuit 15 for the second transistor circuit.

The first transistor circuit 9 is operated by a DC power source voltage supplied from the bias circuit 14 for the first transistor circuit, amplifies a high frequency signal input to an input terminal RFIN, and outputs the signal to a primary inductor device 11f of the transformer 11.

The second transistor circuit 10 is operated by a DC power source voltage supplied from a power source voltage generating circuit (not illustrated), and the high frequency signal amplified by the first transistor circuit 9 is input through the transformer 11. The second transistor circuit 10 amplifies the input high frequency signal, and outputs the signal to an output terminal RFOUT.

The transformer 11 includes four terminals 11a, 11b, 11c, and 11d. The transformer 11 is disposed between the first transistor circuit 9 and the second transistor circuit 10, that is, disposed along a signal path of the high frequency signal, and includes the primary inductor device 11f and a secondary inductor device 11g which are insulated from each other in terms of DC and are magnetically coupled.

The primary inductor device 11f and the secondary inductor device 11g include variable inductance values. A specific circuit configuration of the primary inductor device 11f and the secondary inductor device 11g will be described later with reference to FIG. 5 and FIG. 6.

The transformer 11 transmits the high frequency signal by a magnetic coupling between the primary inductor device 11f and the secondary inductor device 11g. Accordingly, the transformer 11 transmits the high frequency signal amplified by the first transistor circuit 9, and thus inputs the signal to the second transistor circuit 10. Furthermore, the transformer 11 is not limited to a configuration of two winding wires illustrated in FIG. 1, and may have a configuration of three or more winding wires according to a circuit configuration of the variable matching circuit 1 or a mountable area.

A terminal 11a of the primary inductor device 11f is connected to an output terminal (not illustrated) of the first transistor circuit 9. A terminal 11b of the primary inductor device 11f is connected to the bias circuit 14 for the first transistor circuit. A connection point between the primary inductor device 11f and the bias circuit 14 for the first transistor circuit is connected to a ground through the first capacitive element 12.

A terminal 11c of the secondary inductor device 11g is connected to an input terminal (not illustrated) of the second transistor circuit 10. A terminal 11d of the secondary inductor device 11g is connected to the bias circuit 15 for the second transistor circuit. A connection point between the secondary inductor device 11g and the bias circuit 15 for the second transistor circuit is connected to the ground through the second capacitive element 13.

The first capacitive element 12 and the second capacitive element 13 include variable capacitance values. A specific circuit configuration of the first capacitive element 12 and the second capacitive element 13 will be described later with reference to FIG. 2 to FIG. 4.

The bias circuit 14 for the first transistor circuit is connected to the output terminal of the first transistor circuit 9 through the primary inductor device 11f, and supplies the DC power source voltage of the first transistor circuit 9 to the first transistor circuit 9.

The bias circuit 15 for the second transistor circuit is connected to the input terminal of the second transistor circuit 10 through the secondary inductor device 11g, and supplies a DC gate voltage (a DC control voltage) of the second transistor circuit 10 to the second transistor circuit 10.

Furthermore, in FIG. 1, the power source voltage generating circuit for supplying the DC power source voltage to the second transistor circuit 10 is not illustrated. Different DC potentials are applied to the output terminal of the first transistor circuit 9 and the input terminal of the second transistor circuit 10.

The variable matching circuit 1 of this embodiment changes electric power of the high frequency signal which is amplified by the first transistor circuit 9 and is transmitted to the second transistor circuit 10, according to output impedance of the first transistor circuit 9, input impedance of the second transistor circuit 10, an inductance value of the primary inductor device 11f, an inductance value of the secondary inductor device 11g, a capacitance value of the first capacitive element 12, and a capacitance value of the second capacitive element 13. In this embodiment, the output impedance of the first transistor circuit 9 and the input impedance of the second transistor circuit 10 are fixed.

Accordingly, the variable matching circuit 1 changes the inductance value of the respective primary and secondary inductor devices 11f and 11g, and the capacitance value of the respective first and second capacitive elements 12 and 13, and thus can arbitrarily change the electric power of the high frequency signal which is amplified by the first transistor circuit 9 and is transmitted to the second transistor circuit 10. That is, the variable matching circuit 1 can change a gain with respect to the high frequency signal input to the input terminal RFIN.

Figure 2:
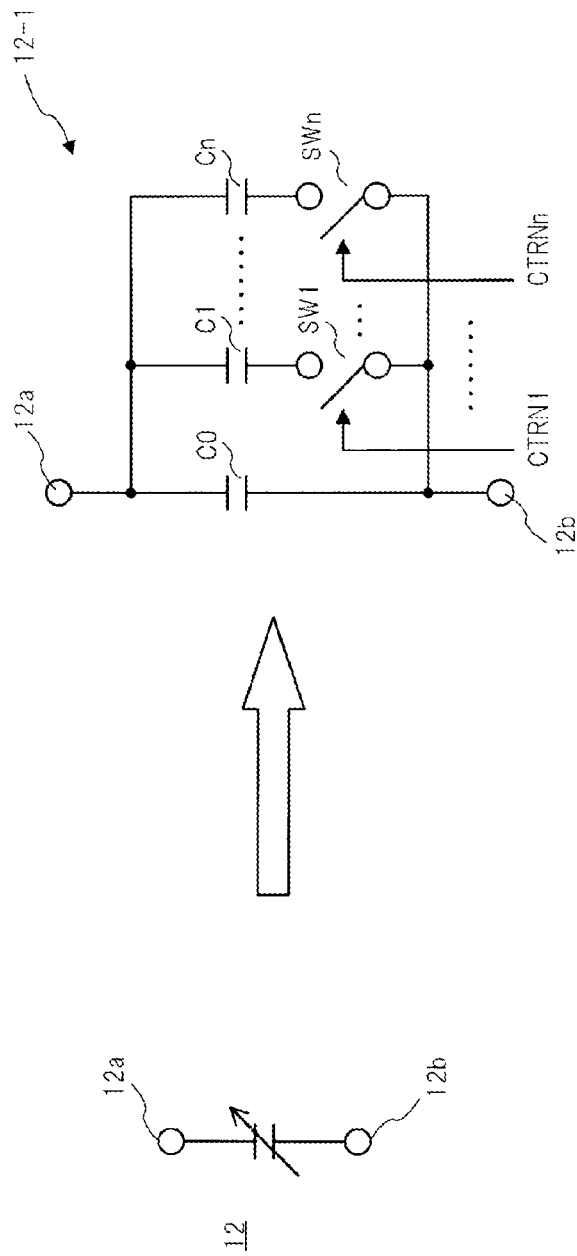
FIG. 2 is a diagram illustrating a first circuit configuration example in which each of first and second capacitive elements includes variable capacitance values.
Figure 3:
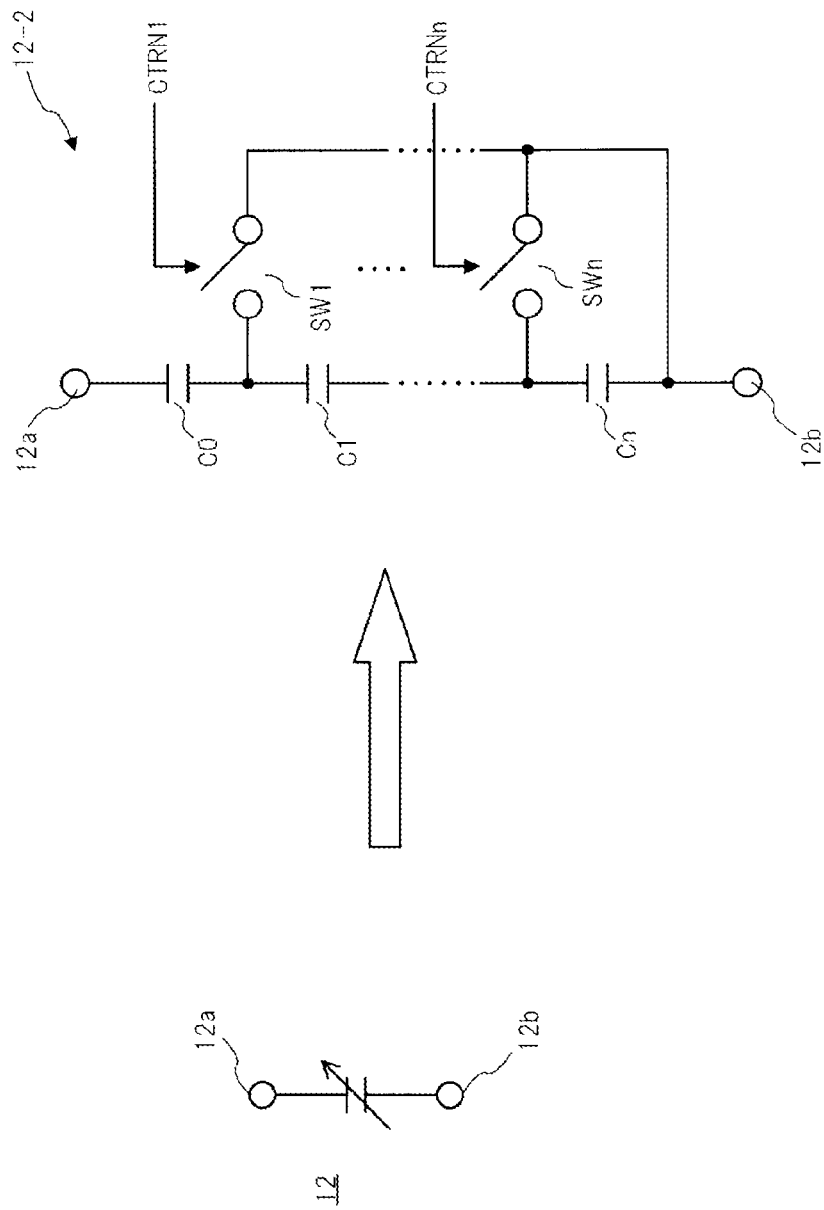
FIG. 3 is a diagram illustrating a second circuit configuration example in which the respective first and second capacitive elements include the variable capacitance values.

Next, a circuit configuration example in which the respective first and second capacitive elements 12 and 13 include the variable capacitance values will be described with reference to FIG. 2 to FIG. 4. FIG. 2 is a diagram illustrating a first circuit configuration example in which the respective first and second capacitive elements include the variable capacitance values. FIG. 3 is a diagram illustrating a second circuit configuration example in which the respective first and second capacitive elements include the variable capacitance values. FIG. 4 is a diagram illustrating a third circuit configuration example in which the respective first and second capacitive elements include the variable capacitance values.

In FIG. 2 to FIG. 4, since the respective first and second capacitive elements 12 and 13 have the same configuration, for the sake of a simple description, the description of the second capacitive element 13 will be omitted, and the first capacitive element 12 will be described.

In the first circuit configuration example, a first capacitive element 12-1 has a configuration in which a fixed capacitive element C0 and sets of N fixed capacitive elements C1 to Cn different from the fixed capacitive element C0 and N switches SW1 to SWn each connected in series are connected in parallel between terminals 12a and 12b. The fixed capacitive element C1 and the switch SW1 are connected in series, and hereinafter, similarly, the fixed capacitive element Cn and the switch SWn are connected in series. The sign "n" is an integer of one or more.

The respective n switches SW1 to SWn are connected to the ground through a terminal 12b (refer to FIG. 1), and are turned ON or OFF according to control signals CTRN1 to CTRNn output by an external control circuit. That is, the respective n switches SW1 to SWn allow conduction or non-conduction between contact points of the switch according to the control signals CTRN1 to CTRNn. In the first capacitive element 12-1, the number of switches to be turned ON is n at maximum, and is 0 at minimum.

The first capacitive element 12-1 can change a capacitance value of the first capacitive element 12-1 according to the number of switches turned ON among the n switches. For example, when all of the switches are turned OFF, the capacitance value of the first capacitive element 12-1 is a capacitance value of the fixed capacitive element C0. In addition, when the switch SW1 is turned ON among the switches SW1 to SWn, the capacitance value of the first capacitive element 12-1 is a parallel combination capacitance value of the fixed capacitive elements C0 and C1.

In the second circuit configuration example, a first capacitive element 12-2 has a configuration in which n+1 fixed capacitive elements C0, and C1 to Cn are connected in series between the terminals 12a and 12b, and sections between the respective fixed capacitive elements C0 to Cn are grounded through the switches SW1 to SWn.

The n switches SW1 to SWn are connected to the ground through the terminal 12b (refer to FIG. 1), and are turned ON or OFF according to the control signals CTRN1 to CTRNn output by the external control circuit. That is, the respective n switches SW1 to SWn allow the conduction or the non-conduction between the contact points of the switches according to the control signals CTRN1 to CTRNn. In the first capacitive element 12-2, the number of switches to be turned ON is 1 at maximum, and is 0 at minimum.

The first capacitive element 12-2 can change a capacitance value of the first capacitive element 12-2 according to the number of switches (1 or 0) being turned ON among the n switches SW1 to SWn, and the switch being turned ON when the number of switches is 1. For example, when all of the switches SW1 to SWn are turned OFF, the capacitance value of the first capacitive element 12-2 is a minimum value which is a series combination capacitance value of C0 to Cn. In addition, when the switch SW1 is turned ON, the capacitance value of the first capacitive element 12-2 is a maximum value which is a capacitance value of the fixed capacitive element C0. In addition, when the switch SWn is turned ON, the capacitance value of the first capacitive element 12-2 is a series combination capacitance value of the fixed capacitive elements C0 to Cn−1 (not illustrated).

In the third circuit configuration example, a first capacitive element 12-3 has a configuration in which n sets of the fixed capacitive elements and the variable capacitive elements (for example, a varactor) which are connected in series are connected in parallel between the terminals 12a and 12b. A control voltage source is connected between the respective fixed capacitive elements and variable capacitive elements. For example, a control voltage source CTSV1 is connected between the fixed capacitive element C1 and the variable capacitive element VRC1. Hereinafter, similarly, a control voltage source CTSVn is connected between the fixed capacitive element Cn and the variable capacitive element VRCn.

The control voltage sources CTSV1 to CTSVn are connected to the ground, and any control voltage is generated to be applied between the terminals of the variable capacitive elements VRC1 to VRCn. The respective variable capacitive elements VRC1 to VRCn change the capacitance value according to a voltage between the terminals applied by the control voltage sources CTSV1 to CTSVn.

The first capacitive element 12-3 can change a capacitance value of the first capacitive element 12-3 according to n parallel combination capacitance values of the series combination capacitance value of the fixed capacitance value of the fixed capacitive elements connected in series and the variable capacitance value of the variable capacitive elements.

Figure 5:
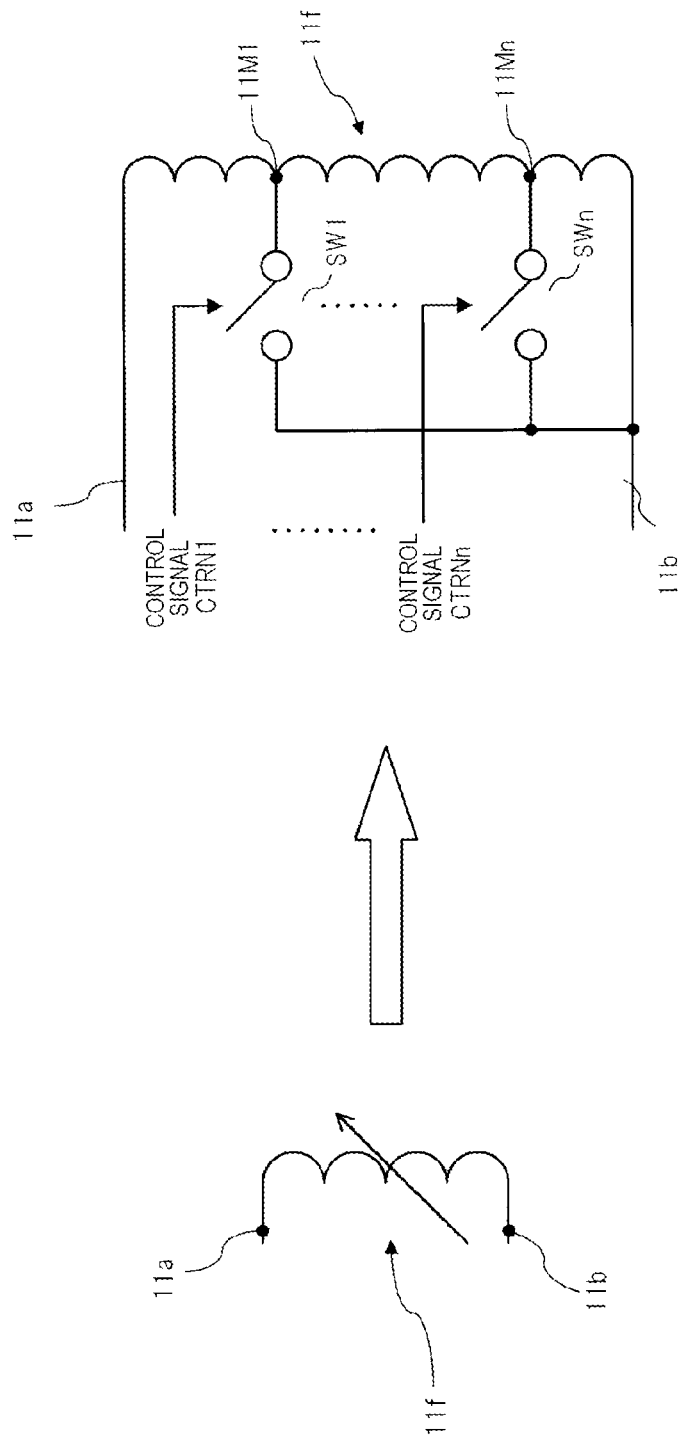
FIG. 5 is a diagram illustrating an example of a circuit configuration in which a primary inductor device and a secondary inductor device include variable inductance values.
Figure 6:
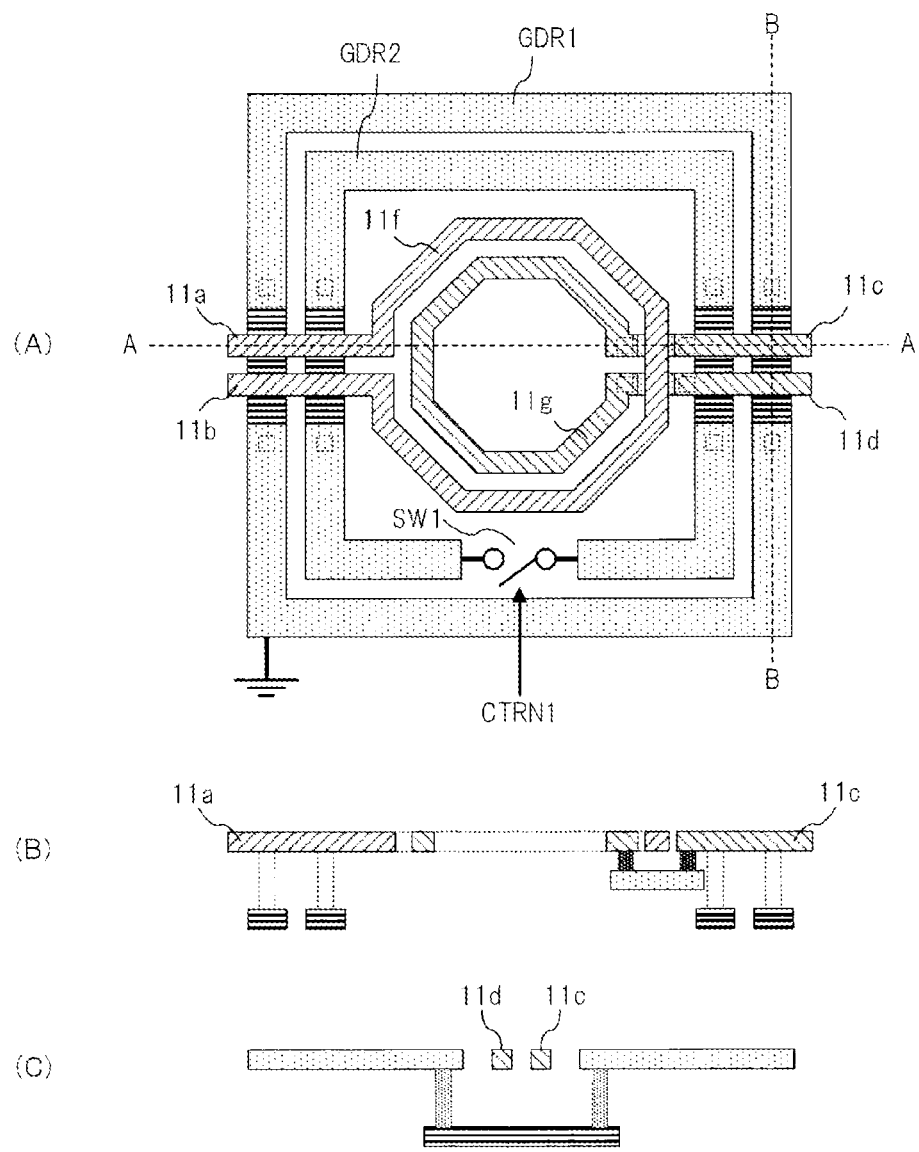
In FIG. 6, (A) is a diagram illustrating an example of a layout of a transformer in which a first inductor and a second inductor include the variable inductance values, (B) is a cross-sectional view cut along line A-A, and (C) is a cross-sectional view cut along line B-B.

Next, a circuit configuration example in which the primary inductor device 11f and the secondary inductor device 11g include the variable inductance values will be described with reference to FIG. 5 and FIG. 6. FIG. 5 is a diagram illustrating an example of a circuit configuration in which the primary inductor device 11f and the secondary inductor device 11g include the variable inductance values. FIG. 6(A) is a diagram illustrating an example of a layout of the transformer 11 in which the primary inductor device 11f and the secondary inductor device 11g include the variable inductance values. FIG. 6(B) is a cross-sectional view cut along line A-A of FIG. 6(A). FIG. 6(C) is a cross-sectional view cut along line B-B of FIG. 6(A).

In FIG. 5, since the primary inductor device 11f and the secondary inductor device 11g have the same configuration, for the sake of a simple description, the description of the secondary inductor device 11g will be omitted, and the primary inductor device 11f will be described.

In FIG. 5, n intermediate terminals 11M1 to 11Mn are disposed in the primary inductor device 11f, and n switches SW1 to SWn are connected between the respective intermediate terminals and the terminal 11b. The respective n switches SW1 to SWn are turned ON or OFF according to the control signals CTRN1 to CTRNn output by the external control circuit. That is, the respective n switches SW1 to SWn allow the conduction or the non-conduction between the contact points of the switches according to the control signals CTRN1 to CTRNn. In the primary inductor device 11f, the number of switches to be turned ON is 1 at maximum, and is 0 at minimum.

The primary inductor device 11f can change an inductance value of the primary inductor device 11f according to the number of switches (1 or 0) being turned ON among the n switches SW1 to SWn, and the switch being turned ON when the number of switches is 1. For example, when all of the switches SW1 to SWn are turned OFF, the inductance value of the primary inductor device 11f is a maximum value which is an inductance value according to a length of the inductor element between the terminal 11a and the terminal 11b. In addition, when the switch SW1 is turned ON, the inductance value of the primary inductor device 11f is a minimum value which is an inductance value according to a length of the inductor element between the terminal 11a and the intermediate terminal 11M1.

In FIG. 6(A), the primary inductor device 11f and the inductor element 11g intersect with each other in a part on the terminal 11c and terminal 11d side, have the same height with respect to a substrate (not illustrated) in the other parts, are wired to have a center axis in common, and are surrounded by guard rings GDR1 and GDR2.

The guard ring GDR1 is wired to surround the primary inductor device 11f, the secondary inductor device 11g, and the guard ring GDR2, and is disposed to prevent a fluctuation of each inductance value of the primary inductor device 11f and the secondary inductor device 11g. The guard ring GDR1 is connected to the ground.

The guard ring GDR2 is wired to surround the primary inductor device 11f and the secondary inductor device 11g, and the switch SW1 is connected to a part of wiring in series. The switch SW1 is turned ON or OFF according to the control signal CTRN1 output by the external control circuit.

When the switch SW1 is turned ON, an induced current flows through the guard ring GDR1 and the guard ring GDR2 according to a magnetic flux generated in the primary inductor device 11f and the secondary inductor device 11g.

On the other hand, when the switch SW1 is turned OFF, the induced current flows through the guard ring GDR1 according to the magnetic flux generated in the primary inductor device 11f and the secondary inductor device 11g.

For this reason, when the switch SW1 is turned ON, the transformer 11 can reduce each inductance value of the primary inductor device 11f and the secondary inductor device 11g, compared to a case where the switch SW1 is turned OFF.

Furthermore, in the variable matching circuit 1 of this embodiment, all of each inductance value of the primary inductor device 11f and the secondary inductor device 11g, the capacitance value of the first capacitive element 12, and the capacitance value of the second capacitive element 13 may not necessarily be the variable capacitance value, and at least one may be the variable capacitance value. Accordingly, the variable matching circuit 1 can change a transmission amount of the electric power of the input high frequency signal with respect to a following stage circuit, that is, can change the gain with respect to the high frequency signal.

As described above, in the variable matching circuit 1 of this embodiment, the circuit element connected in series to the signal path through which the high frequency signal passes is the transformer 11, and other passive elements (for example, the capacitive element) in addition to the transformer 11 are not connected in series, and thus it is possible to suppress the loss in the high frequency signal, and broadband matching characteristics are obtained.

Further, the variable matching circuit 1 changes an element constant of the passive element (for example, the transformer 11, the first capacitive element 12, and the second capacitive element 13) disposed in an output stage of the first transistor circuit 9, and changes the gain, and thus it is possible to suppress degradation of reflection characteristics of the high frequency signal and noise figure characteristics, compared to Patent Literature 1 and Patent Literature 2.

Modification Example of First Embodiment

Figure 7:
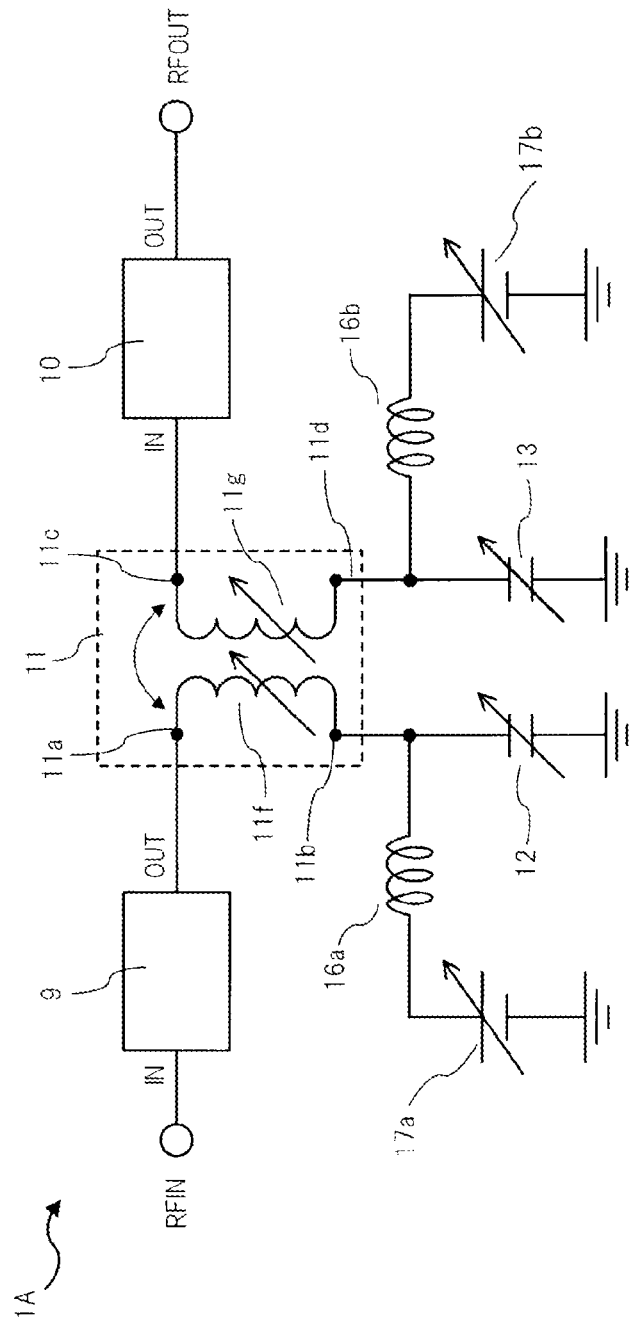
FIG. 7 is a diagram illustrating an internal configuration of a variable matching circuit according to a modification example of the first embodiment.

FIG. 7 is a diagram illustrating an internal configuration of a variable matching circuit 1A according to a modification example of the first embodiment. In the variable matching circuit 1A of this modification example, as the bias circuit 14 for the first transistor circuit in the variable matching circuit 1 illustrated in FIG. 1, a choke coil 16a and a variable voltage source 17a are illustrated, and as the bias circuit 15 for the second transistor circuit, a choke coil 16b and a variable voltage source 17b are illustrated.

One end of the choke coil 16a is connected to the terminal 11b, the other end thereof is connected to the variable voltage source 17a, and the choke coil 16a transmits a DC potential by being open in terms of AC.

One end of the choke coil 16b is connected to the terminal 11d, the other end thereof is connected to the variable voltage source 17b, and the choke coil 16b transmits the DC potential by being open in terms of AC.

The variable voltage source 17a is connected to the ground, generates the DC power source voltage of the first transistor circuit 9, and supplies the voltage to the choke coil 16a. The variable voltage source 17a can arbitrarily change a value of the DC power source voltage of the first transistor circuit 9.

The variable voltage source 17b is connected to the ground, generates the DC gate voltage of the second transistor circuit 10, and supplies the voltage to the choke coil 16b. The variable voltage source 17b can arbitrarily change a value of the DC gate voltage of the second transistor circuit 10.

The low noise amplifier disclosed in Non Patent Literature 1 described above changes the value of the DC gate voltage supplied to the gate terminal of the transistor circuit, and changes the gain. Here, when the gain is changed into the low gain, the DC gate voltage V_1 illustrated in FIG. 14, that is, the region in which the gradient (the gain) of the current with respect to the DC gate voltage is nonlinear is used. For this reason, gain linearity of the low noise amplifier is degraded.

In this modification example, any one of each inductance value of the primary inductor device 11f and the secondary inductor device 11g, the first capacitive element 12, and the second capacitive element 13 is the variable capacitance value, in addition, the DC power source voltage of the first transistor circuit 9 and the DC gate voltage of the second transistor circuit 10 are also variable.

Figure 14:
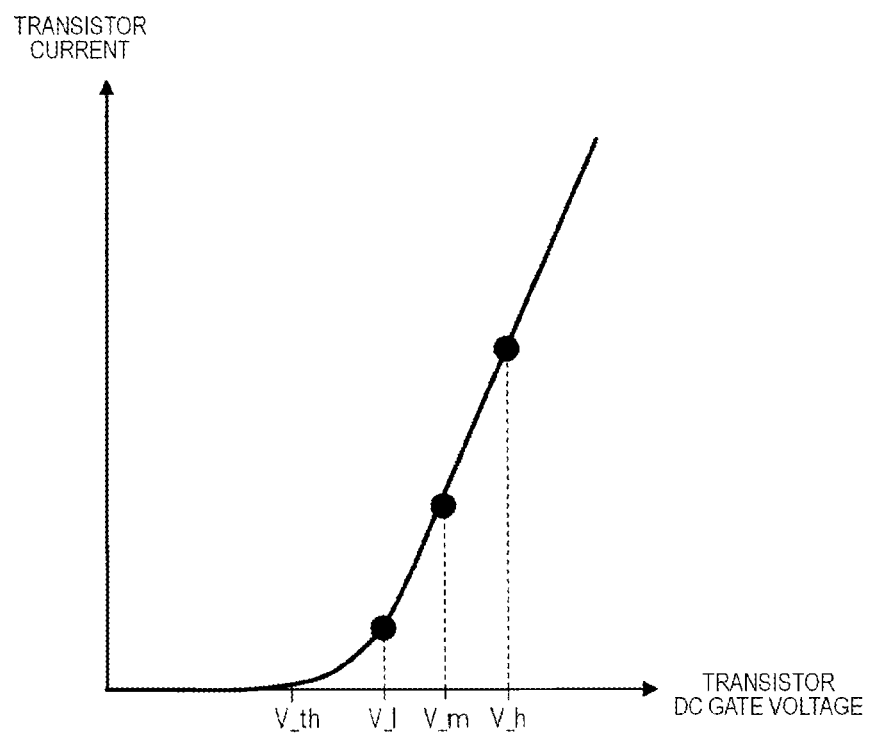
FIG. 14 is a graph illustrating a relationship between a gate voltage applied to a gate of the transistor and a current flowing through the transistor.

As described above, even when the gain is changed into the low gain, the variable matching circuit 1A uses the DC gate voltage V_m other than the DC gate voltage V_1 illustrated in FIG. 14, that is, a region in which the gradient (the gain) of the current with respect to the DC gate voltage is linear, and thus can reduce the current flowing through the first transistor circuit 9 and the current flowing through the gate terminal of the second transistor circuit 10, and to avoid characteristics degradation of the first transistor circuit 9 and the second transistor circuit 10.

Further, even when the gain is changed into the low gain, the variable matching circuit 1A of this modification example suppresses the degradation of the gain linearity compared to the low noise amplifier disclosed in Non Patent Literature 1, and thus it is possible to change the gain.

Figure 8:
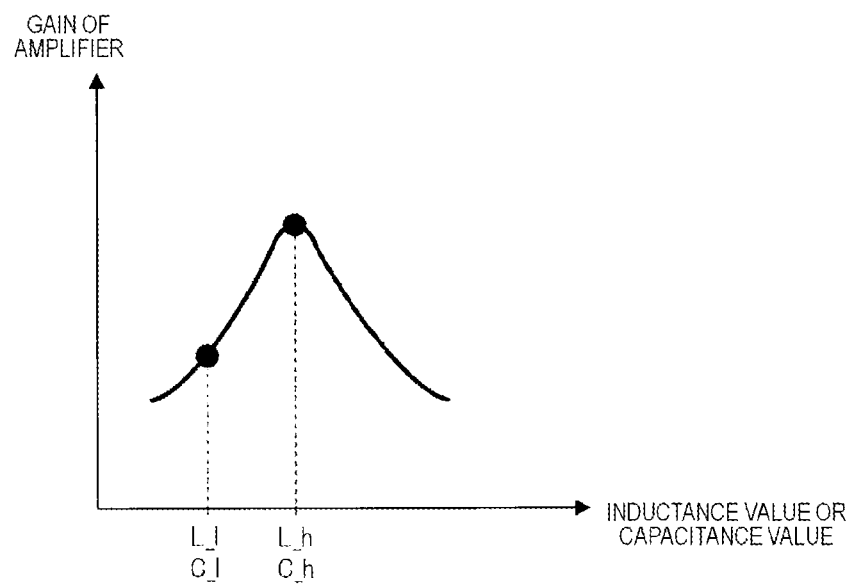
FIG. 8 is a graph illustrating a relationship between an inductance value or a capacitance value and a gain of an amplifier.

FIG. 8 is a graph illustrating a relationship between the inductance value or the capacitance value and the gain of the amplifier. When the gain is changed into a high gain, the variable matching circuit 1A of this modification example changes the inductance value or the capacitance value from L_l or C_l to L_h or C_h, and thus it is possible to change the gain of the amplifier using the variable matching circuit 1A into a maximum value.

In addition, when the gain is changed into the low gain, the variable matching circuit 1A changes the inductance value or the capacitance value from L_h or C_h to L_l or C_l, and thus it is possible to change the gain of the amplifier using the variable matching circuit 1A into a minimum value.

Second Embodiment

Figure 9:
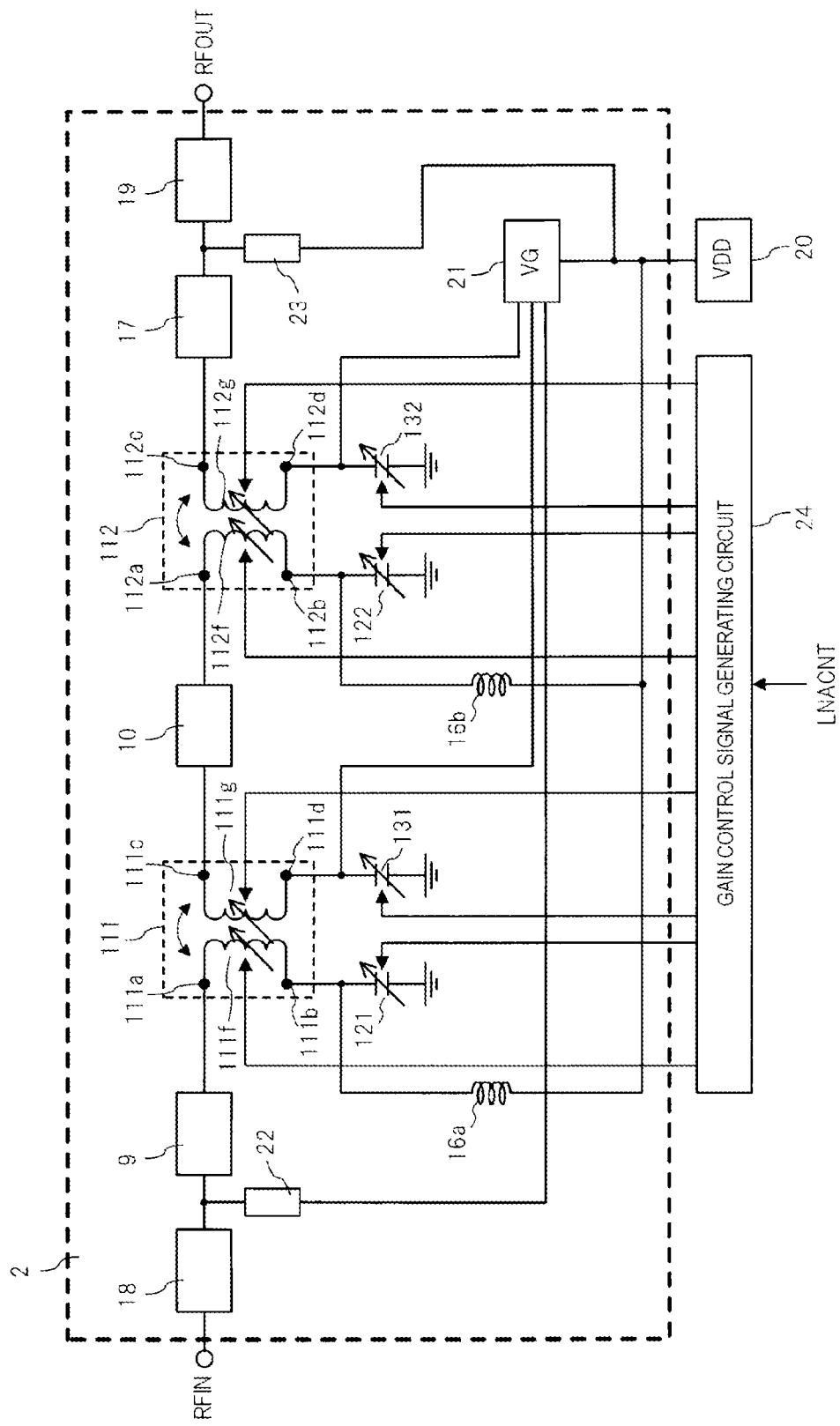
FIG. 9 is a diagram illustrating a circuit configuration of an amplifier according to a second embodiment.

In the second embodiment, a circuit configuration of the amplifier using the variable matching circuit 1 according to the first embodiment will be described. Furthermore, the same configurations as those of the variable matching circuit 1 according to the first embodiment are represented by the same reference numerals or signs, the description thereof will be omitted or simplified, and different configurations will be described. FIG. 9 is a diagram illustrating a circuit configuration of an amplifier 2 according to the second embodiment. The amplifier 2 is used, for example, as a low noise amplifier (LNA) connected to a following stage of a receiving antenna.

The amplifier 2 illustrated in FIG. 9 includes an input matching circuit 18, a DC potential transmission circuit 22, two variable matching circuits 1 (refer to FIG. 1), an output matching circuit 19, a DC potential transmission circuit 23, and a DC control voltage generating circuit 21. Among the two variable matching circuits used in the amplifier 2, a second transistor circuit 10 illustrated in FIG. 9 is operated as the second transistor circuit 10 (refer to FIG. 1) of the variable matching circuit in a first stage, and is operated as the first transistor circuit 9 (refer to FIG. 1) of the variable matching circuit in a second stage.

The input matching circuit 18 is disposed between an input terminal RFIN of the amplifier 2 and an input terminal of a first transistor circuit 9, and matches an output impedance of an antenna (not illustrated) with an input impedance of the first transistor circuit 9.

A terminal 111a is connected to an output terminal of the first transistor circuit 9, a terminal 111c is connected to an input terminal of the second transistor circuit 10, and the transformer 11 of the variable matching circuit 1 according to the first embodiment is disposed between the terminal 111a and the terminal 111c.

Similarly, a terminal 112a is connected to an output terminal of the second transistor circuit 10, a terminal 112c is connected to an input terminal of a third transistor circuit 17, and a transformer 112 identical to the transformer 111 of the variable matching circuit 1 according to the first embodiment is disposed between the terminal 112a and the terminal 112c.

The output matching circuit 19 is disposed between an output terminal of the third transistor circuit 17 and an output terminal RFOUT of the amplifier 2, and matches an output impedance of the third transistor circuit 17 with an input impedance of a circuit in the following stage.

One ends of the choke coils 16a and 16b are connected to the terminal 111b and the terminal 112b, and the other ends of the choke coils 16a and 16b are connected to the power source voltage generating circuit (VDD) 20. The choke coils 16a and 16b are connected between the terminal 111b and the terminal 112b, and the power source voltage generating circuit 20, and the variable matching circuit of the first stage and the variable matching circuit of the second stage are able to change each capacitance value of a first capacitive element 121 and a first capacitive element 122 into a different capacitance value.

The terminal 111d and the terminal 112d are connected to the DC control voltage generating circuit 21 which generates a different DC gate voltage (a DC control voltage) according to each transistor circuit by using the DC power source voltage supplied by the power source voltage generating circuit 20.

One end of the DC potential transmission circuit 22 is connected to a connection point between the input matching circuit 18 and an input end of the first transistor circuit 9, the other end thereof is connected to the DC control voltage generating circuit 21, and the DC potential transmission circuit 22 is operated by applying the DC gate voltage (the DC control voltage) to a gate of the first transistor circuit 9.

One end of the DC potential transmission circuit 23 is connected to a connection point between an output end of the third transistor circuit 17 and the output matching circuit 19, the other end thereof is connected to the power source voltage generating circuit 20, and the DC potential transmission circuit 23 is operated by applying the DC power source voltage to the third transistor circuit 17.

The amplifier 2 changes each inductance value of the primary inductor device 111f, the secondary inductor device 111g, the primary inductor device 112f, and the secondary inductor device 112g, and each capacitance value of the first capacitive element 121, the second capacitive element 131, the first capacitive element 122, and the second capacitive element 132 according to each control signal which is output by a gain control signal generating circuit 24 according to a gain control signal LNACNT.

The gain control signal generating circuit 24 has a table (not illustrated) in which a correspondence relationship between the gain and the inductance value of the inductor element and between the gain and the capacitance value of the capacitive element is defined. The gain control signal generating circuit 24 determines which inductor element or capacitive element is designated by an inductance value or a capacitance value after being changed according to the input gain control signal LNACNT with reference to the table, and outputs the control signal.

Accordingly, the amplifier 2 of this embodiment has a configuration using the variable matching circuit according to the first embodiment, the circuit element connected in series to the signal path through which the high frequency signal passes is the transformers 111 and 112, and other passive elements (for example, the capacitive element) in addition to the transformers 111 and 112 are not connected in series, and thus it is possible to reduce the loss in the high frequency signal.

In addition, the amplifier 2 can obtain broadband matching characteristics. Further, the amplifier 2 changes an element constant of the passive element (for example, the transformer 11, the first capacitive element 12, and the second capacitive element 13) disposed in an output stage of the first transistor circuit 9, and changes the gain, and thus it is possible to suppress degradation of reflection characteristics of the high frequency signal and noise figure characteristics, compared to Patent Literatures 1 and 2.

Figure 10:
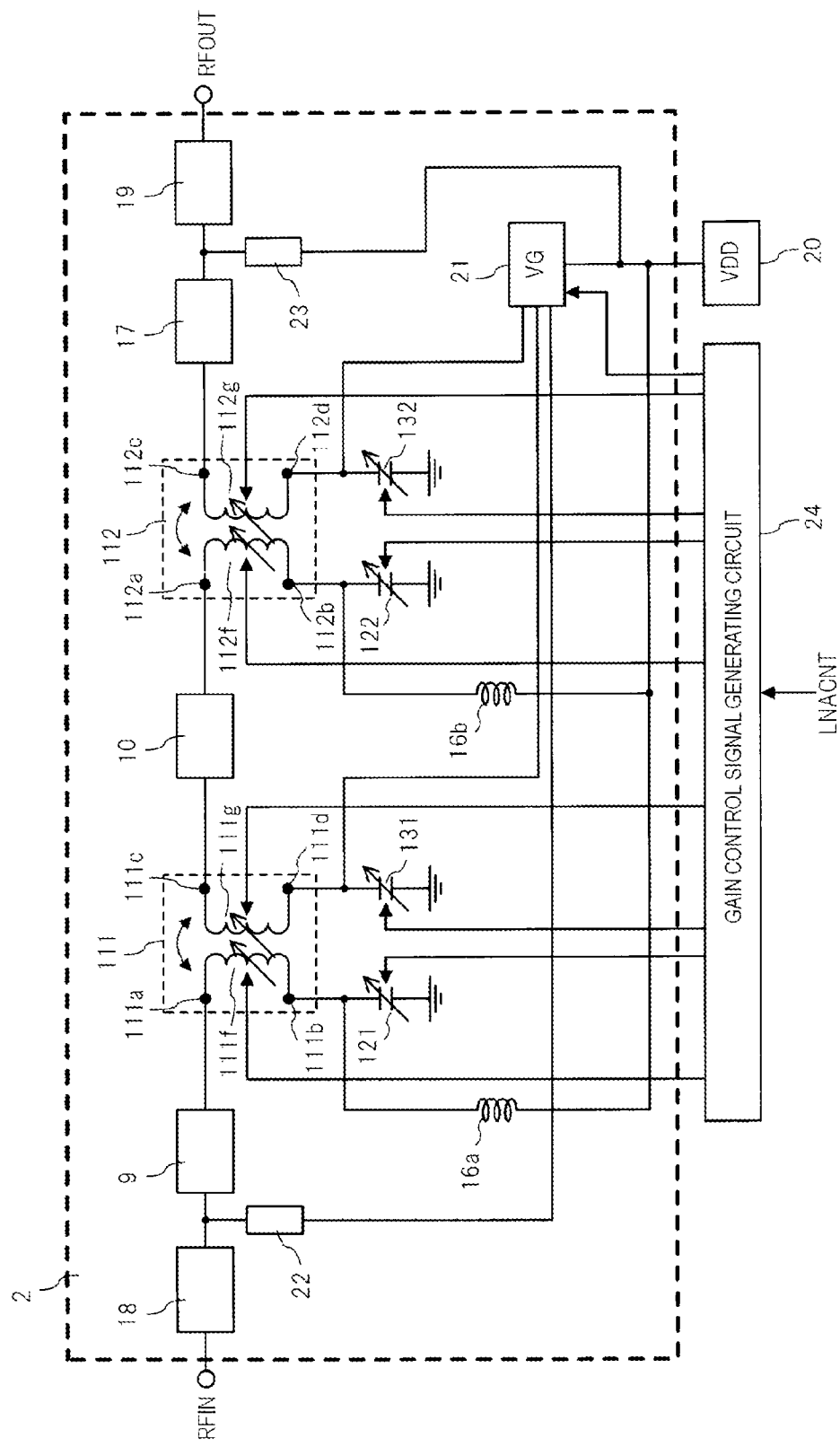
FIG. 10 is a diagram illustrating a circuit configuration of the amplifier which can change a DC gate voltage of each transistor circuit.

Furthermore, in the amplifier 2, the DC control voltage generating circuit 21 may generate and supply the DC gate voltage (the DC control voltage) of the respective first, second, and third transistor circuits 9, 10, and 17 according to the voltage control signal output by the gain control signal generating circuit 24 (refer to FIG. 10). FIG. 10 is a diagram illustrating a circuit configuration of the amplifier 2 which can change the DC gate voltage of each transistor circuit.

Figure 11:
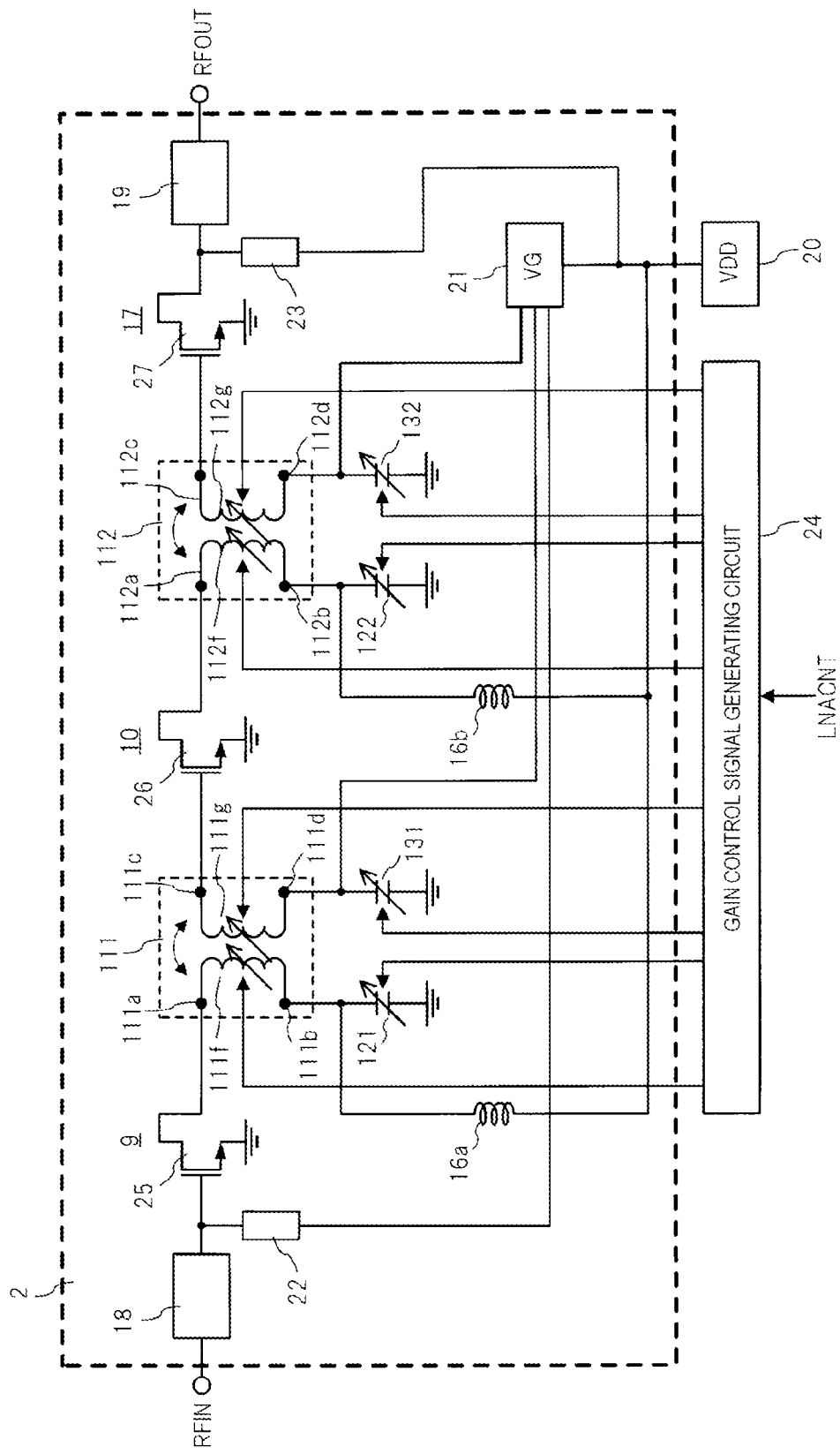
FIG. 11 is a diagram illustrating a circuit configuration of the amplifier using a CMOS transistor in each transistor circuit.

FIG. 11 is a diagram illustrating a circuit configuration of the amplifier 2 using a Complementary Metal Oxide Semiconductor (CMOS) transistor in each transistor circuit. A transistor 25 corresponds to the first transistor circuit 9 illustrated in FIG. 9. A transistor 26 corresponds to the second transistor circuit 10 illustrated in FIG. 9. A transistor 27 corresponds to the third transistor circuit 17 illustrated in FIG. 9.

A gate terminal of the transistor 25 is connected to the input matching circuit 18, a drain terminal thereof is connected to the terminal 111a, and a source terminal thereof is connected to the ground. A gate terminal of the transistor 26 is connected to the terminal 111c, a drain terminal thereof is connected to the terminal 112a, and a source terminal thereof is connected to the ground. A gate terminal of the transistor 27 is connected to the terminal 112c, a drain terminal thereof is connected to the output matching circuit 19, and a source terminal thereof is connected to the ground.

Figure 12:
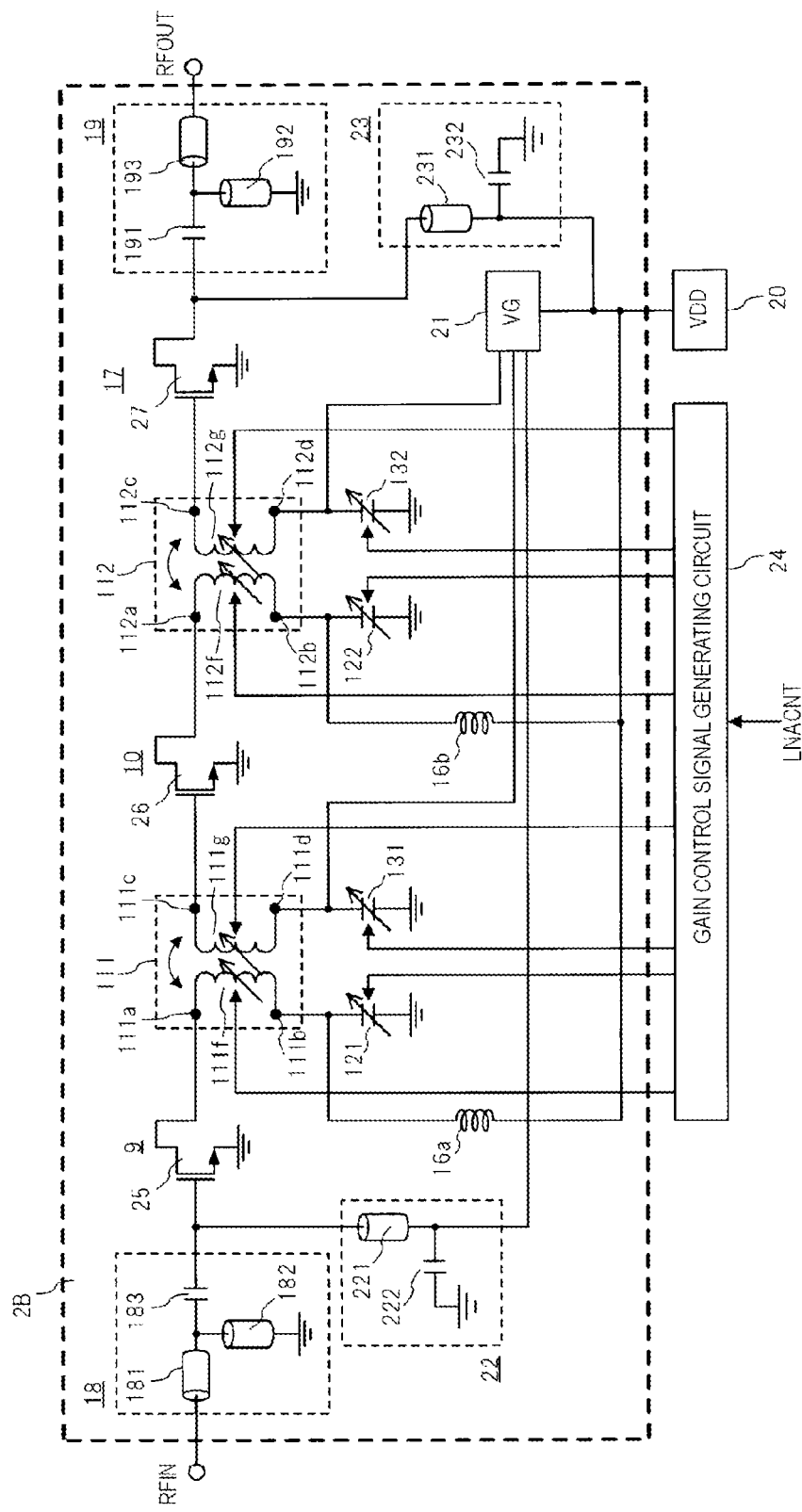
FIG. 12 is a diagram illustrating a circuit configuration of the amplifier, in which a first example of an input matching circuit, an output matching circuit, and a DC potential transmission circuit in the amplifier illustrated in FIG. 11 is illustrated.

FIG. 12 is a diagram illustrating a circuit configuration of the amplifier 2, in which a first example of the input matching circuit 18, the output matching circuit 19, and the DC potential transmission circuits 22 and 23 in the amplifier 2 illustrated in FIG. 11 is illustrated.

The input matching circuit 18 includes transmission lines 181 and 182, and a capacitive element 183. One end of the transmission line 181 is connected to the input terminal RFIN of the amplifier 2, and the other end thereof is connected to one end of the transmission line 182 and one end of the capacitive element 183. The other end of the transmission line 182 is connected to the ground. The other end of the capacitive element 183 is connected to the gate terminal of the transistor 25 and one end of a transmission line 221 described later.

The DC potential transmission circuit 22 includes the transmission line 221, and a capacitive element 222. The other end of the transmission line 221 is connected to one end of the capacitive element 222 and the DC control voltage generating circuit 21. The other end of the capacitive element 222 is connected to the ground.

The output matching circuit 19 includes a capacitive element 191, and transmission lines 192 and 193. One end of the capacitive element 191 is connected to the drain terminal of the transistor 26 and one end of the transmission line 231 described later, and the other end thereof is connected to one end of the transmission lines 192 and 193. The other end of the transmission line 192 is connected to the ground. The other end of the transmission line 193 is connected to the output terminal RFOUT of the amplifier 2.

The DC potential transmission circuit 23 includes a transmission line 231, and a capacitive element 232. The other end of the transmission line 231 is connected to the capacitive element 232 and the DC control voltage generating circuit 21. The other end of the capacitive element 232 is connected to the ground.

Figure 13:
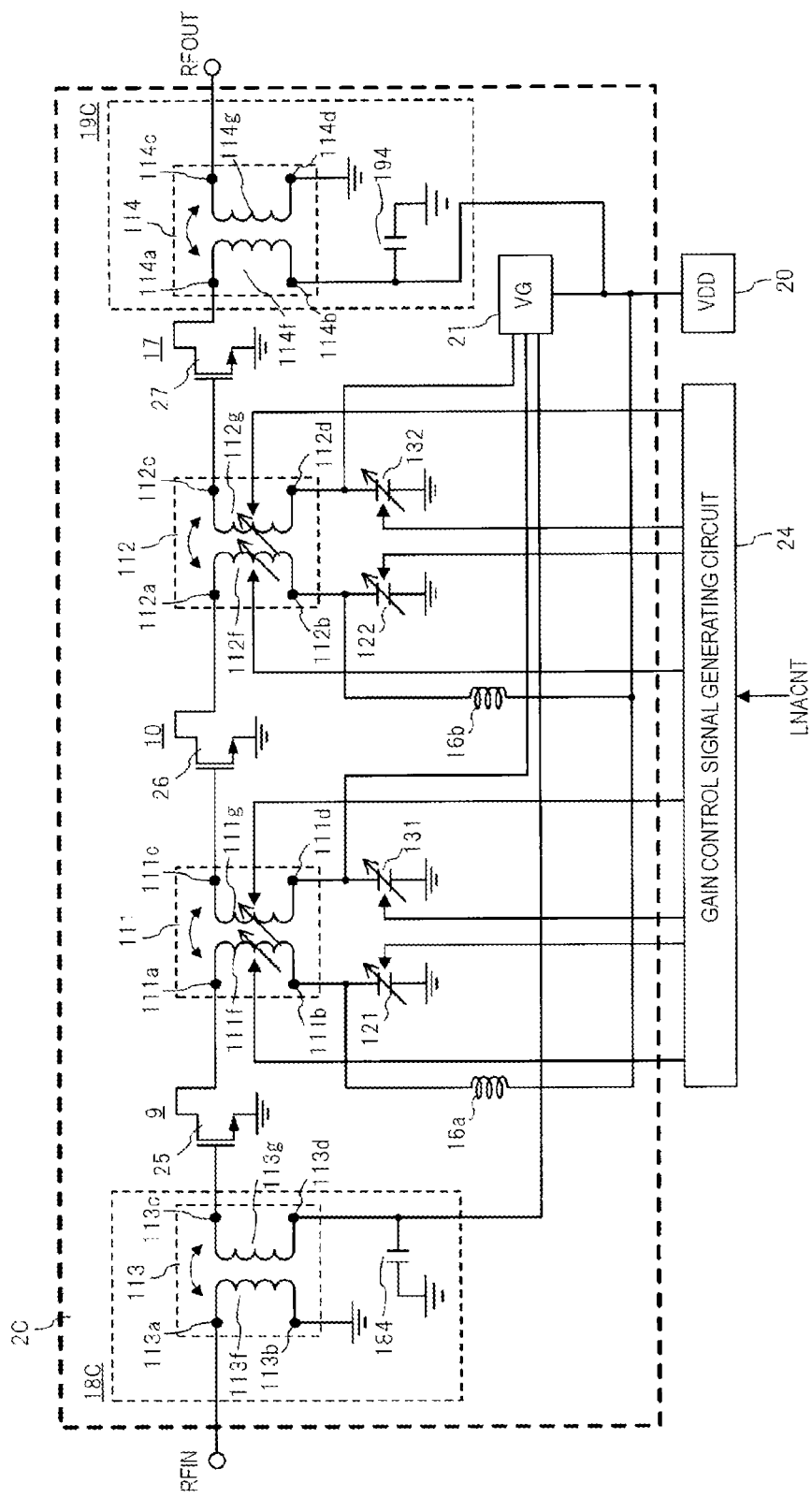
FIG. 13 is a diagram illustrating a circuit configuration of the amplifier, in which a second example of the input matching circuit, the output matching circuit, and the DC potential transmission circuit in the amplifier illustrated in FIG. 11 is illustrated.

FIG. 13 is a diagram illustrating a circuit configuration of the amplifier 2C, in which a second example of the input matching circuit 18, and the output matching circuit 19 in the amplifier 2 illustrated in FIG. 11 is illustrated. An input matching circuit 18C illustrated in FIG. 13 includes the DC potential transmission circuit 22 illustrated in FIG. 12. The output matching circuit 19 illustrated in FIG. 13 includes the DC potential transmission circuit 23 illustrated in FIG. 12.

The input matching circuit 18C includes a transformer 113, and a capacitive element 184. The transformer 113 includes four terminals 113a, 113b, 113c, and 113d, is disposed along the signal path of the high frequency signal, and includes a primary inductor device 113f and a secondary inductor device 113g which are insulated from each other in a DC manner and are magnetically coupled.

The terminal 113a is connected to an input terminal RFIN of the amplifier 2C, and the terminal 113c is connected to the gate terminal of the transistor 25. The terminal 113b is connected to the ground, and the terminal 113d is connected to the DC control voltage generating circuit 21 and one end of the capacitive element 184. Furthermore, the other end of the capacitive element 184 is connected to the ground.

The transformer 113 transmits the high frequency signal by a magnetic coupling between the primary inductor device 113f and the secondary inductor device 113g. Each inductance value of the primary inductor device 113f and the secondary inductor device 113g is a defined fixed value.

The input matching circuit 18C serves as the DC potential transmission circuit 22 which supplies the DC gate voltage of the transistor 25 supplied by the DC control voltage generating circuit 21 to the gate terminal of the transistor 25 in the secondary inductor device 113g of the transformer 113.

An output matching circuit 19C includes a transformer 114, and a capacitive element 194. The transformer 114 includes four terminals 114a, 114b, 114c, and 114d, is disposed along the signal path of the high frequency signal, and includes a primary inductor device 114f and a secondary inductor device 114g which are insulated from each other in the DC manner and are magnetically coupled.

The terminal 114a is connected to the drain terminal of the transistor 27, and the terminal 114c is connected to an output terminal RFOUT of the amplifier 2C. The terminal 114b is connected to the power source voltage generating circuit 20 and one end of the capacitive element 194, and the terminal 114d is connected to the ground. Furthermore, the other end of the capacitive element 194 is connected to the ground.

The transformer 114 transmits the high frequency signal by a magnetic coupling between the primary inductor device 114f and the secondary inductor device 114g. Each inductance value of the primary inductor device 114f and the secondary inductor device 114g is a defined fixed value.

The output matching circuit 19C serves as the DC potential transmission circuit 23 which supplies the DC power source voltage of the transistor 27 supplied by the power source voltage generating circuit 20 to the drain terminal of the transistor 27 in the primary inductor device 114f of the transformer 114.

Accordingly, the amplifier 2C uses the transformers 113 and 114 in the input matching circuit 18C and the output matching circuit 19C, and thus functions of the DC potential transmission circuit 22 and the DC potential transmission circuit 23 are able to be included in the input matching circuit 18C and the output matching circuit 19C, thereby allowing a circuit area of the amplifier 2C, and the number of components to be reduced.

Further, in the amplifier 2C, the capacitive element is not connected in series to the signal path of the high frequency signal input to the input terminal RFIN, and thus it is possible to reduce the loss in the high frequency signal.

As described above, various embodiments have been described with reference to the drawings, but the present disclosure is not limited to these examples. It is obvious that various modification examples or changed examples may be made by a person having ordinary skill in the art within a category described in claims, and it is understood that the examples belong to a technical range of the present disclosure.

This application is based on Japanese Patent Application No. 2013-037685 filed on Feb. 27, 2013, the contents of which are incorporated in this application by reference.

INDUSTRIAL APPLICABILITY

The present disclosure is useful as a variable matching circuit and an amplifier which reduce a loss in an input high frequency signal and change a gain.

REFERENCE SIGNS LIST 1, 1A: variable matching circuit
2, 2C: amplifier
9: first transistor circuit
10: second transistor circuit
11: transformer
11f: primary inductor device
11g: secondary inductor device
11M1, 11Mn: intermediate terminal
12, 12-1, 12-2, 12-3: first capacitive element
13: second capacitive element
14: bias circuit of first transistor circuit
15: bias circuit of second transistor circuit
16a, 16b: choke coil
17a, 17b: variable voltage source
18, 18C: input matching circuit
19, 19C: output matching circuit
20: power source voltage generating circuit
21: DC control voltage generating circuit
22, 23: DC potential transmission circuit
24: gain control signal generating circuit
GDR1, GDR2: guard ring
LNACNT: gain control signal

The invention claimed is:

1. An amplifier comprising:
a first transistor circuit which amplifies a high frequency signal;
a second transistor circuit which amplifies the high frequency signal amplified by the first transistor circuit;
a first DC potential transmission circuit which applies a DC control voltage to an input terminal of the first transistor circuit;
a second DC potential transmission circuit which applies a DC power source voltage to an output terminal of the second transistor circuit;
a transformer which is disposed between the respective first and second transistor circuits, wherein a primary inductor device and a secondary inductor device are magnetically coupled in the transformer;
a first capacitive element;
a second capacitive element; and
a choke coil which passes the DC power source voltage of the first transistor circuit between the primary inductor device and a bias circuit for the first transistor circuit, wherein
the primary inductor device is connected between an output terminal of the first transistor circuit and the bias circuit for the first transistor circuit,
the secondary inductor device is connected between an input terminal of the second transistor circuit and a bias circuit for the second transistor circuit,
a connection point between the primary inductor device and the bias circuit for the first transistor circuit is connected to the first capacitive element,
a connection point between the secondary inductor device and the bias circuit for the second transistor circuit is connected to the second capacitive element, and
at least one of inductance values of the respective primary and secondary inductor devices and capacitance values of the respective first and second capacitive elements is variable.

2. The amplifier according to claim 1, further comprising:
a DC control voltage generating circuit which generates a plurality of different DC control voltages, wherein
the DC control voltage generating circuit outputs a DC control voltage for the first transistor circuit to the first DC potential transmission circuit, and supplies a DC control voltage different from the DC control voltage for the first transistor circuit to the second transistor circuit.

3. The amplifier according to claim 2, wherein the DC control voltage generating circuit generates the DC control voltages for the respective first and second transistor circuits according to voltage control signals for each input DC control voltage.

4. The amplifier according to claim 1, further comprising:
an input matching circuit which matches an input impedance of the high frequency signal; and
an output matching circuit which matches an output impedance of the high frequency signal.

5. The amplifier according to claim 4, wherein
the input matching circuit includes a first transformer in which a first inductor and a second inductor are magnetically connected, wherein the first inductor is connected to a signal path of the high frequency signal, and the second inductor serves as the first DC potential transmission circuit for applying the DC control voltage to the input terminal of the first transistor circuit, and
the output matching circuit includes a second transformer in which a first inductor and a second inductor are magnetically coupled, wherein the first inductor serves as the second DC potential transmission circuit for applying the DC power source voltage to the output terminal of the second transistor circuit, and the second inductor is connected to a signal path of the high frequency signal.

6. A variable matching circuit comprising:

a first transistor circuit which amplifies a high frequency signal;

a second transistor circuit which amplifies the high frequency signal amplified by the first transistor circuit;

a transformer which is disposed between the first and second transistor circuits, wherein a primary inductor device and a secondary inductor device are magnetically coupled in the transformer;

a first capacitive element;

a second capacitive element;

a switch; and a first wiring which is connected to both ends of the switch and surrounds the transformer, wherein the primary inductor device is connected between an output terminal of the first transistor circuit and a bias circuit for the first transistor circuit, the secondary inductor device is connected between an input terminal of the second transistor circuit and a bias circuit for the second transistor circuit, a connection point between the primary inductor device and the bias circuit for the first transistor circuit is connected to the first capacitive element, a connection point between the secondary inductor device and the bias circuit for the second transistor circuit is connected to the second capacitive element, at least one of inductance values of the respective primary and secondary inductor devices and capacitance values of the respective first and second capacitive elements is variable, and the inductance values of the respective primary and secondary inductor devices are changed according to conduction or non-conduction of the switch.

7. The variable matching circuit according to claim 6, wherein the respective first and second capacitive elements comprise a first capacitive unit and n sets of other capacitive units, which differ from the first capacitive unit, each of the capacitive units including a switch connected in series, the capacitive units are connected in parallel, and the capacitance values of the respective first and second capacitive elements are changed according to switches being turned to an "ON" state among the n switches.

8. The variable matching circuit according to claim 6, wherein the respective first and second capacitive elements comprise n+1 capacitive units connected in series, nodes between the respective capacitive units are grounded through switches, and the capacitance values of the respective first and second capacitive elements are changed according to an "ON" or "OFF" state of the n switches.

9. The variable matching circuit according to claim 6, wherein the respective first and second capacitive elements comprise n sets of fixed capacitive units and variable capacitive units, each set is connected in parallel, and the capacitance values of the respective first and second capacitive elements are changed according to a potential difference between each terminal of the n variable capacitive elements.

10. The variable matching circuit according to claim 6, wherein the respective primary and secondary inductor devices comprise n intermediate terminals, where n is an integer of one or more, switches are connected in series between the respective intermediate terminals and the first or the second capacitive element, and the inductance values of the respective primary and secondary inductor devices are changed according to an "ON" state of any one switch among the n switches.

11. The variable matching circuit according to claim 6, wherein second wiring for surrounding the transformer is disposed outside the first wiring, and the second wiring is connected to a ground.

12. The variable matching circuit according to claim 6, wherein the bias circuit for the first transistor circuit changes a DC power source voltage of the first transistor circuit, and the bias circuit for the second transistor circuit changes a DC control voltage of the second transistor circuit.

* * * * *